United States Patent [19]

Suzuki et al.

[11] Patent Number: 5,053,909
[45] Date of Patent: Oct. 1, 1991

[54] SEMICONDUCTOR INTEGRATED CIRCUIT DEVICE

[75] Inventors: Yasunaga Suzuki; Toshiaki Matsubara; Akira Uragami, all of Takasaki, Japan

[73] Assignee: Hitachi, Ltd., Tokyo, Japan

[21] Appl. No.: 346,409

[22] Filed: May 2, 1989

Related U.S. Application Data

[63] Continuation of Ser. No. 97,173, Sep. 16, 1987, Pat. No. 4,827,368, which is a continuation of Ser. No. 840,655, Mar. 18, 1986, Pat. No. 4,710,842.

[30] Foreign Application Priority Data

Mar. 25, 1985 [JP] Japan ................... 60-58366

[51] Int. Cl.⁵ .............................................. H02H 3/20
[52] U.S. Cl. ..................... 361/88; 361/93; 307/303; 307/482.1
[58] Field of Search ............ 361/78, 79, 88, 90, 361/91, 92, 93; 307/200 A, 200 B, 200 R, 296 R, 303, 443, 549, 551, 567; 357/23.13

[56] References Cited

U.S. PATENT DOCUMENTS

| | | | |
|---|---|---|---|
| 3,601,625 | 8/1971 | Redwine | 357/23.13 |
| 4,385,337 | 5/1983 | Asano et al. | 357/23.13 |
| 4,408,245 | 10/1983 | Pryor | 361/91 |
| 4,449,158 | 5/1984 | Taira | 361/91 |
| 4,710,842 | 12/1987 | Suziki et al. | 361/88 |
| 4,827,368 | 5/1989 | Suziki et al. | 361/88 |
| 4,829,344 | 5/1989 | Bertotti et al. | 357/23.13 |

Primary Examiner—J. R. Scott
Assistant Examiner—Jeffrey A. Gaffin
Attorney, Agent, or Firm—Antonelli, Terry, Stout & Kraus

[57] ABSTRACT

Disclosed is a semiconductor integrated circuit device equipped with a buffer portion which includes a pair of an input buffer portion and an output buffer portion. When an input circuit equipped with an input protection circuit is formed at the input buffer portion, circuit elements for an output circuit disposed at the output buffer portion are used in order to constitute the input protection circuit.

11 Claims, 8 Drawing Sheets

SEMICONDUCTOR INTEGRATED CIRCUIT DEVICE

This is a continuation of application Ser. No. 097,173, filed Sept. 16, 1987, now U.S. Pat. No. 4,827,368, which is a continuation of application Ser. No. 840,655, filed Mar. 18, 1986, now U.S. Pat. No. 4,710,842.

BACKGROUND OF THE INVENTION

This invention relates generally to a semiconductor integrated circuit device (hereinafter called an "IC"), and more particularly to a technique which is suitable when used for a semi-custom gate array IC.

Gate arrays have been drawing increasing attention in recent years as one of the types of semi-custom ICs which make it possible to efficiently produce an LSI in accordance with a user's requirement.

A gate array is an IC that constitutes a desired logic circuit by extending wiring on a base chip (a semiconductor substrate on which a large number of circuit elements are fabricated in advance).

Hitachi, Ltd. has developed a large-scale gate array in which the number of gates of an internal logic circuit is several thousand. This IC is equipped with buffer circuits having a level conversion function at the input-output portions thereof so that the IC can be connected to various systems.

As a result of studies, the inventors of the present invention have found that elements in an input buffer circuit are likely to be damaged by an external surge voltage. This invention is completed in order to cope with such a problem.

SUMMARY OF THE INVENTION

The following is a typical example of the inventions disclosed herein.

The present invention is based upon the concept that an input buffer and an output buffer are constituted as a pair, and that either one of them is selectively constituted. In a gate array or the like, an input protection circuit of an input (output) buffer circuit is constituted by use of those circuit elements which constitute an output (input) buffer circuit. This circuit arrangement can sufficiently improve the dielectric breakdown strength of the input (output) buffer circuit formed in the buffer portion of the gate array without using exclusive circuit elements for constituting the input protection circuit in one buffer portion. In addition, the circuit arrangement restricts the increase of the occupying area of the buffer portion and attains a higher integration density.

DESCRIPTION OF THE PREFERRED EMBODIMENTS

Figure 1:
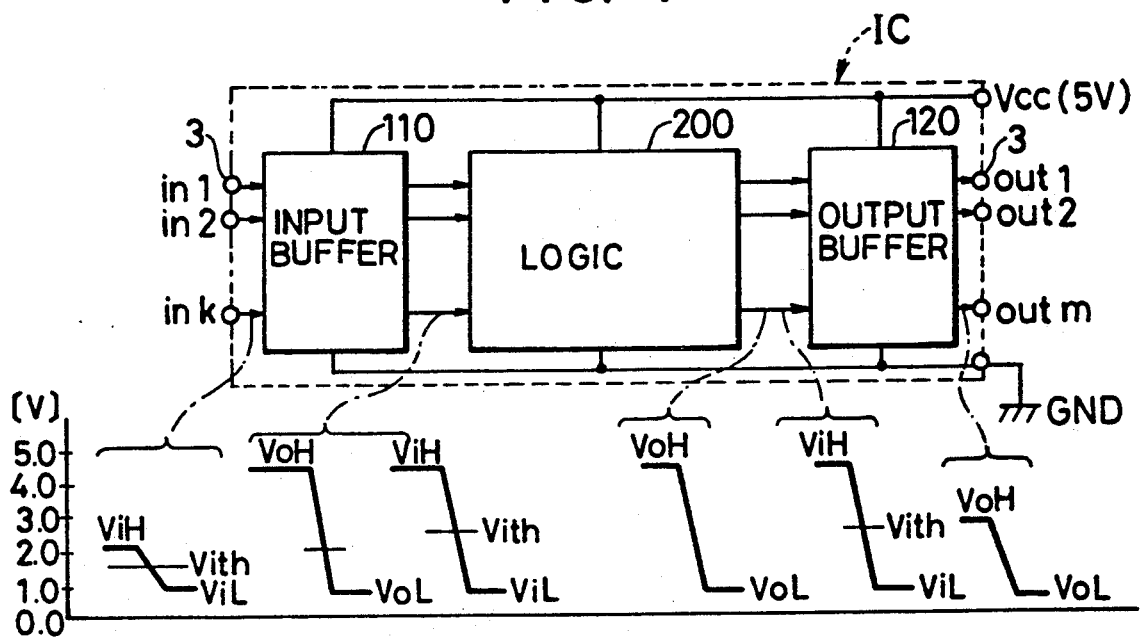
FIG. 1 is a system diagram showing a system configuration of a gate array and a signal level at each block of the system.

Studies by the present inventors before the present invention

In a gate array developed by the Applicant of the present invention (Hitachi, Ltd.), a large number of buffer portions are formed together with an internal circuit portion in which a large number of basic cells are formed and arranged. In this case, the basic cells are used to constitute a logic circuit or system in accordance with a customer's request. In each buffer portion, circuit elements for constituting an input buffer circuit and circuit elements for constituting an output buffer circuit are formed as a pair. A circuit constituted in an internal circuit portion or either one of the input and output buffer circuits is selectively constituted in accordance with a given system.

When the input buffer circuit is to be constituted in the buffer portion, an input protection circuit must also be formed simultaneously in order to protect the input buffer circuit from damage due to an abnormally high voltage applied from outside such as static electricity, for example. Therefore, circuit elements exclusive for constituting the input protection circuit must be formed for each buffer portion.

If the circuit elements, which are only for constituting the input protection circuit in the buffer portion, are formed simultaneously, a greater occupying area must be secured as much for the buffer portion. When the output buffer circuit is to be constituted, the circuit elements exclusive for constituting the input protection circuit for it become useless. In either case, the circuit elements which are only for constituting the input protection circuit reduce the utilization ratio of the limited layout area of a semiconductor chip.

Embodiment of the Invention

First of all, the summary of the gate array will be described with reference to FIG. 1.

As shown in the drawing, input and output buffer portions 110 and 120 are formed together with an internal circuit 200 in a semiconductor IC in which gate array is constituted. The input and output buffer portions 110 and 120 are interposed between the internal circuit 200 and terminal pads 3 for external connection, respectively, and function as buffers having a level conversion function.

In FIG. 1, symbol $V_{ith}$ represents an input threshold value; $V_iH$ is an input logic level at the time of H (high) level; $V_iL$ is an input logic level at the time of L (low) level; $V_oH$ is an output logic level at the time of H (high) level; and $V_oL$ is an output logic level at the time of L (low) level. Symbols inl~ink represent logic inputs with respect to outside, and outl~outm are logic outputs with respect to the outside.

Figure 2:
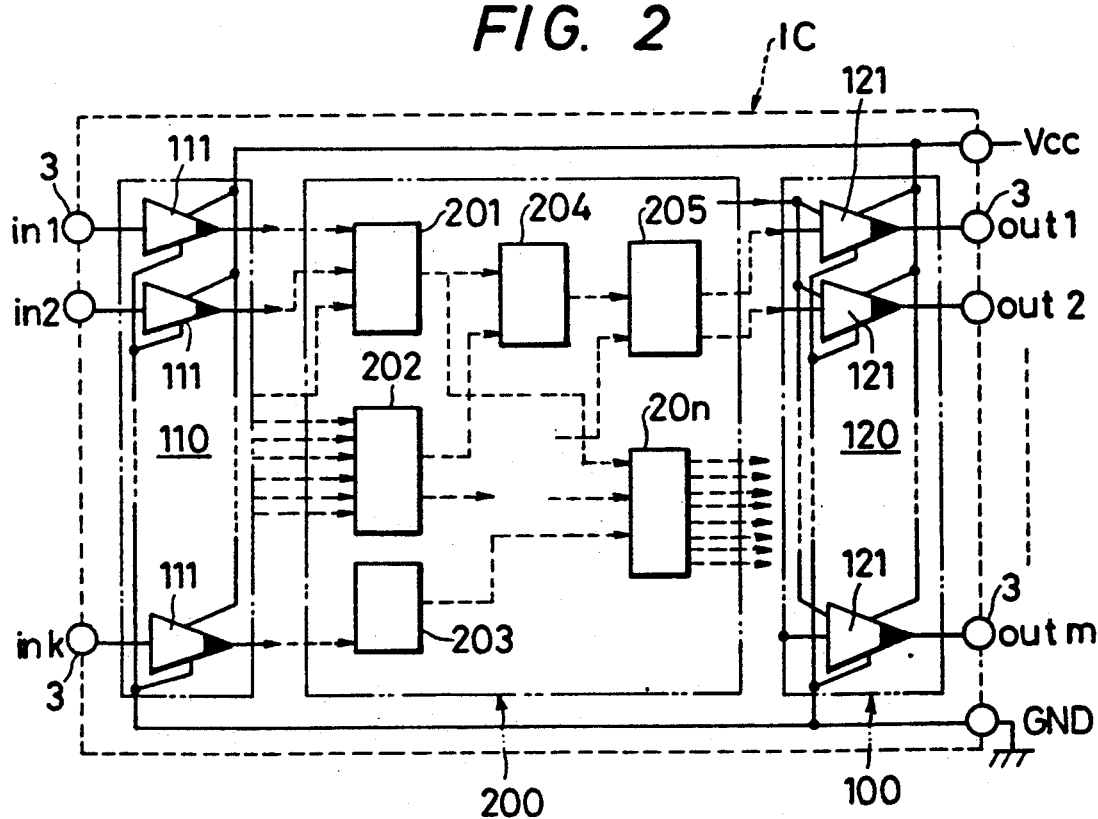
FIG. 2 is a block diagram showing in more detail the circuit construction of the gate array shown in FIG. 1.

FIG. 2 shows the outline of the circuit in the semiconductor IC.

In the drawing, a large number logic function units (macro-cells) 201~20n and wirings (dotted lines) connecting the macro-cells with one another are formed in the internal circuit 200 in accordance with a customer's request. A great number of input buffer circuits 111 are formed in the input buffer portion 110 while a great number of output buffer circuits 121 are formed in the output buffer portion 120, whenever necessary.

Figure 3:
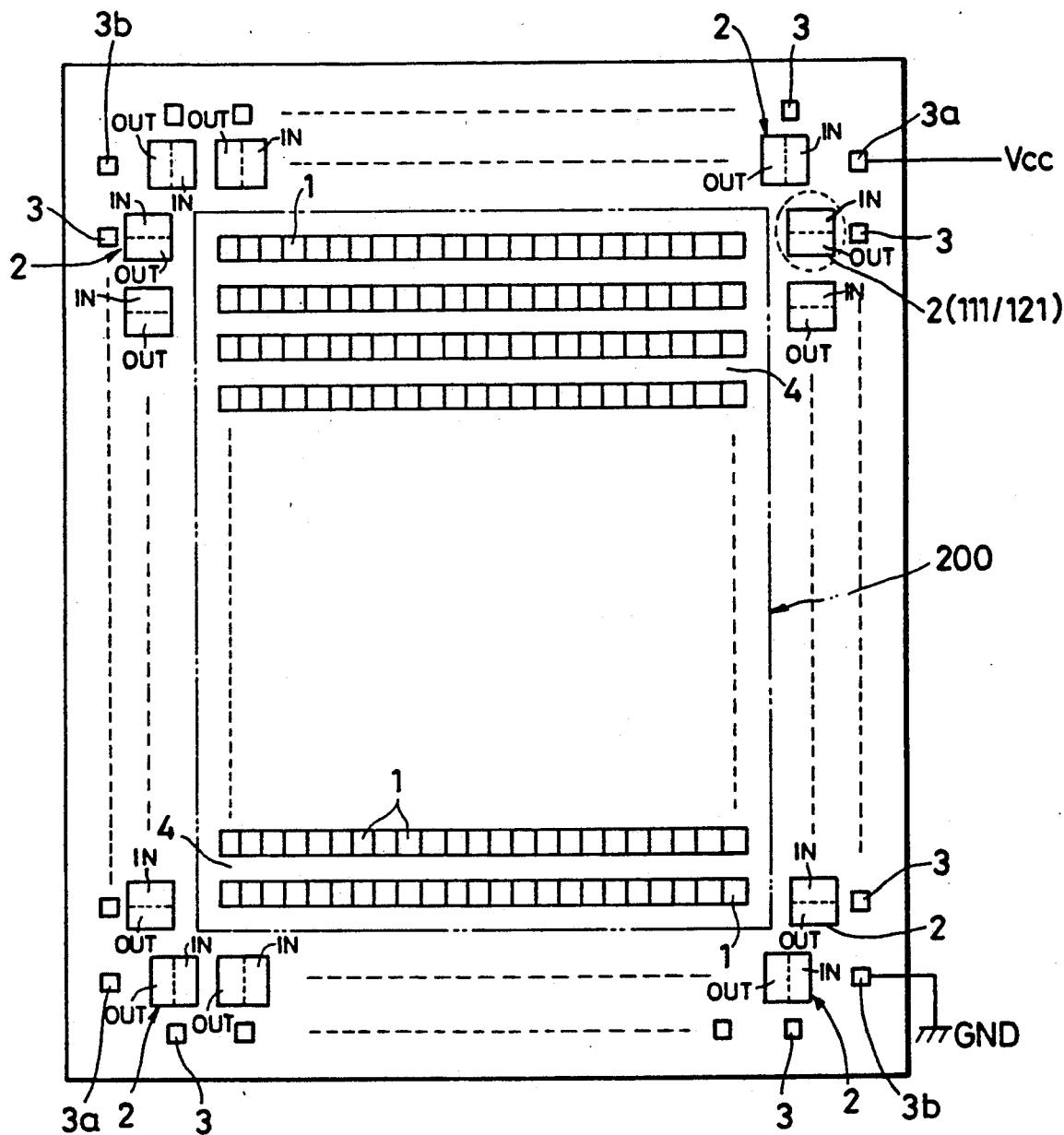
FIG. 3 is a planar layout diagram of a gate array in accordance with one embodiment of the present invention.

FIG. 3 shows the outline of the layout of the semiconductor IC described above.

In the drawing, reference numeral 1 represents a basic cell 1. Circuit elements necessary for constituting a basic logic circuit are formed in the basic cell 1. A great number of basic cells 1 having the same pattern are arranged. Reference numeral 4 represents wiring regions for connecting the basic cells 1 with one another. Each of the logic circuit units (macro-cells) 201~20n shown in FIG. 2 is constituted by use of one or a plurality of these basic cells 1.

Reference numeral 2 represents an I/O buffer portion. Either one of the input buffer circuit 111 and the output buffer circuit 121 is selectively formed in this buffer portion 2. A great number of these buffer portions are arranged around the internal circuit portion 200.

Reference numeral 3 represents a terminal pad for external connection. A great number of terminal pads 3 are disposed outside the buffer portions described above, and are used either as input terminals or output terminals in accordance with the kind of the circuits formed in the buffer portions 2 at the corresponding positions.

Besides the terminal pads 3 that are used as the input and output terminals, terminal pads 3a and 3b used as power and ground terminals, respectively, are also disposed.

Figure 4:
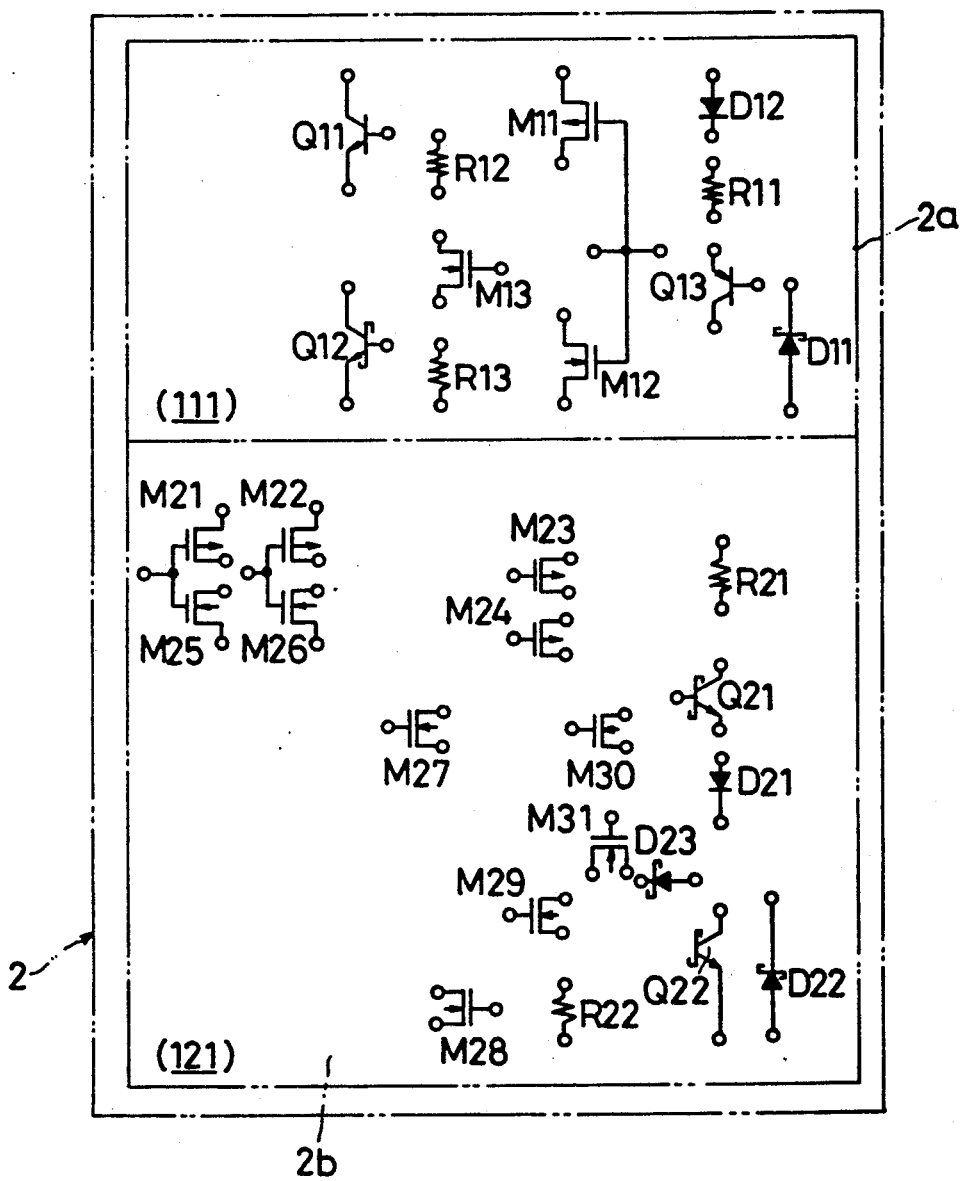
FIG. 4 is a circuit diagram of a buffer portion 2 enclosed by dashed lines in FIG. 3 before aluminum wiring is extended.

FIG. 4 shows the portion of the buffer portion 2 shown in FIG. 3, which is encompassed by dotted line, before Al wiring is formed. As shown in the drawing, regions 2a for the input buffer circuits and the regions 2b for the output buffer circuits are formed so as to form pairs, inside the buffer portion 2.

In the regions 2a, circuit elements are provided which are necessary for constituting the input buffer circuit (111), such as MOSFETs M11, M12, M13, bipolar transistors Q11, Q12, diodes D11, D12 and resistors R11, R12, R13.

In the region 2b, circuit elements are provided which are necessary for constituting the output buffer circuit (121); such as MOSFETs M21~M24, n-channel MOSFETs M25~M31, diodes D21, D22, D23, resistors R21, R22 and bipolar transistors Q21, Q22.

Figure 5:
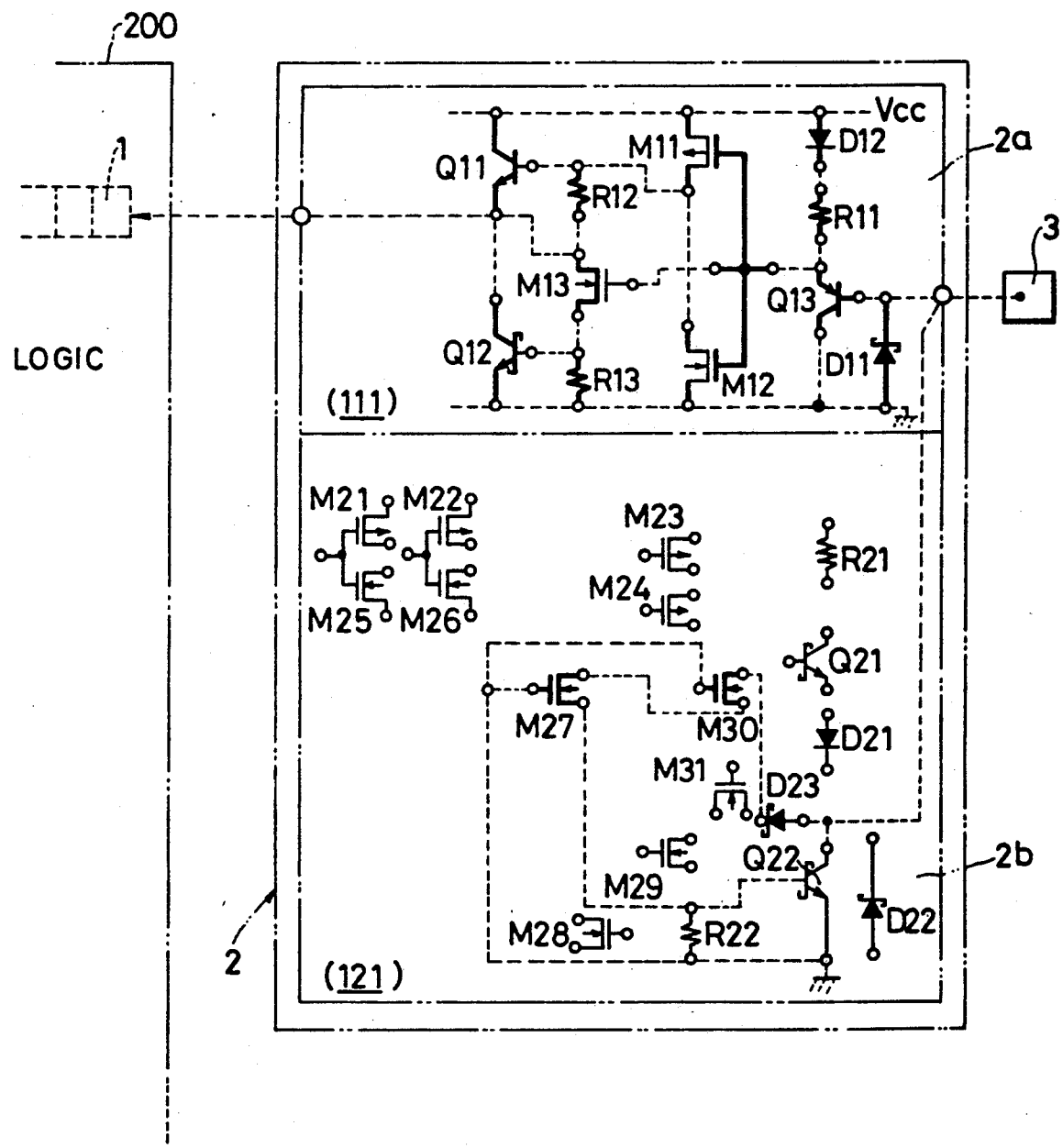
FIG. 5 is a circuit diagram showing the buffer portion 2 in FIG. 4 after the aluminum wiring is extended.
Figure 6:
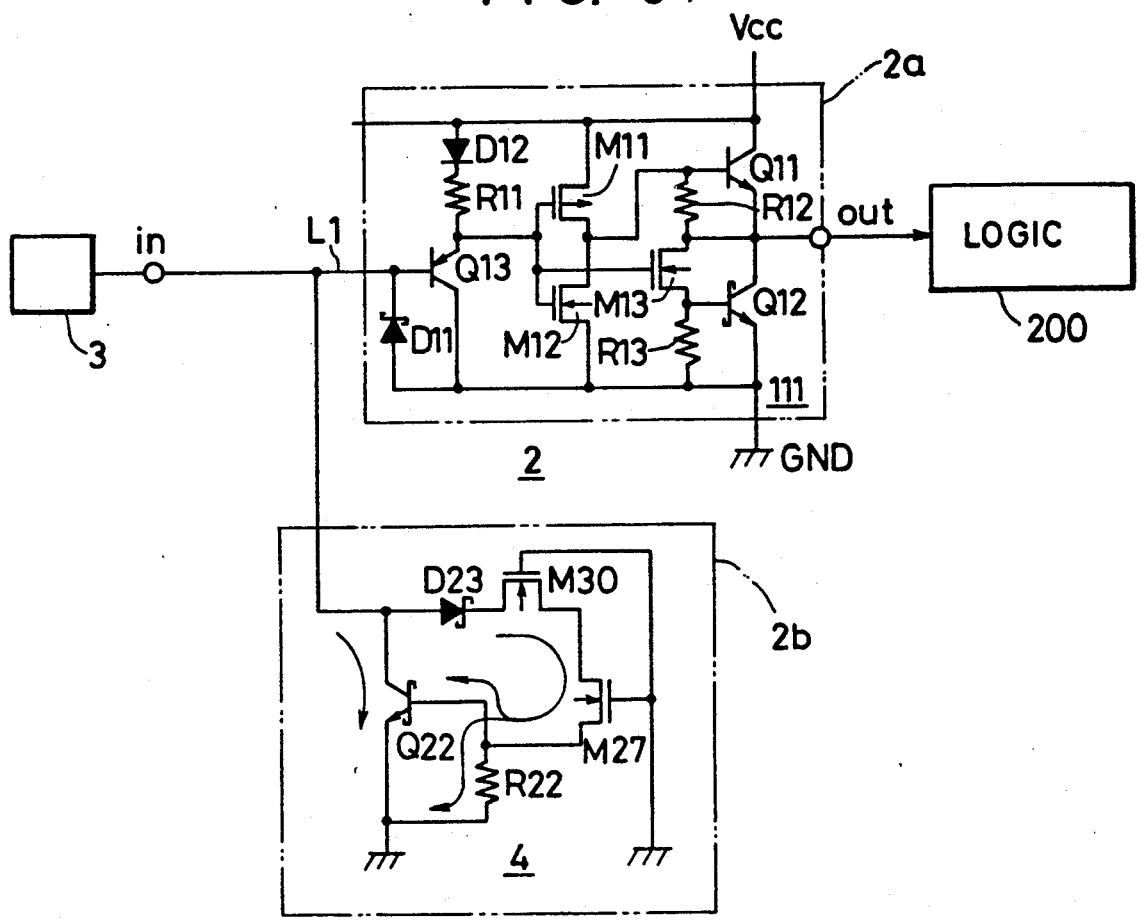
FIG. 6 is a circuit diagram of an input buffer circuit equipped with a protection circuit in accordance with one embodiment of the present invention.

FIG. 5 shows an embodiment of the present invention. In the drawing, an input buffer circuit equipped with a protection circuit is shown completed by forming aluminum wiring (represented by dotted lines in the drawing) for the buffer portio. shown in FIG. 4. FIG. 6 is a circuit diagram after wiring is formed as shown in FIG. 5. As shown in FIG. 6, the buffer portion 2 is disposed between the internal circuit portion 200 and the terminal pad 3 for external connection. In this buffer portion 2, the region 2a for the input buffer circuit (111) and the region 2b for the output buffer circuit (121) are formed as a pair.

The circuit elements for forming the input circuit 111, that is, MOSFETs M11, M12, M13, bipolar transistors Q11, Q12, diodes D11, D12 and resistors R12, R13, are formed in the region 2a, while the circuit elements for forming the output buffer circuit (121), that is, bipolar transistor Q22, diode D23, MOSFETs M30, M27, are formed in the region 2b.

Symbol $V_{cc}$ represents a power source potential; GND is a common ground potential; in is a buffer input; and out is a buffer output.

Here, an input protection circuit 4 is formed on the input side of the input buffer circuit 111.

The operation of this protection circuit 4 is as follows.

Since the gates of the N-MOSFETs M30, M27 are grounded, these MOSFETs serve as the impedance members having an infinite resistance.

It will now be assumed that an excessive surge voltage is applied to the line $l_1$ through the bonding pad 3. Then, a current flows through the path consisting of the diode D23 and the N-MOSFETs M27 and M30, and momentarily turns on the transistor Q22. Since the surge energy is caused to escape to the ground point through the emitter-collector path of this transistor Q22, the breakdown of the transistor Q13 at the initial stage of the input buffer circuit can be prevented.

Figure 7:
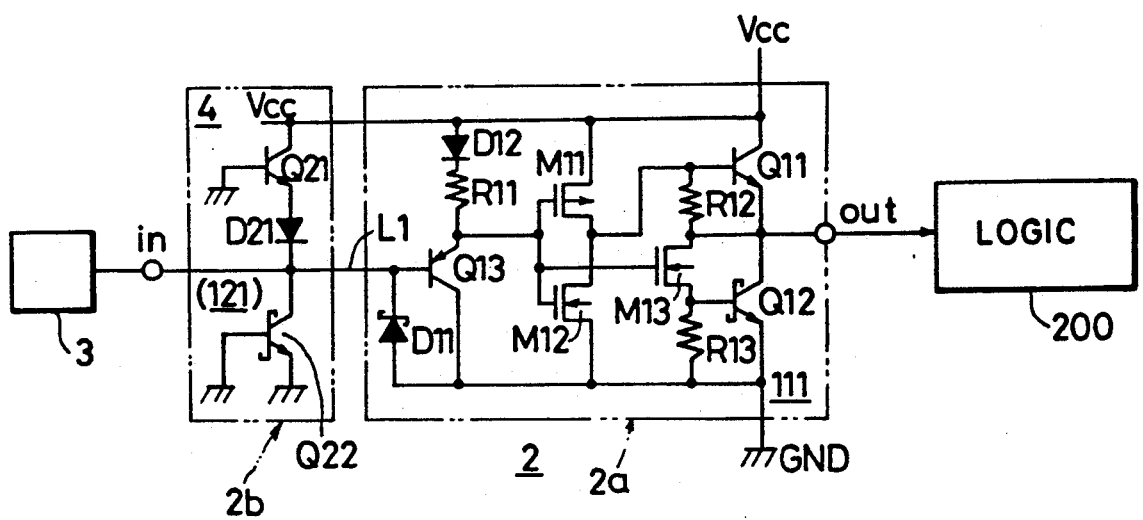
FIG. 7 is a circuit diagram of an input buffer circuit equipped with a protection circuit in accordance with another embodiment of the present invention.

FIG. 7 shows another example of the protection circuit 4. This protection circuit 4 consists of two transistors Q21 and Q22 whose emitter-collector paths are connected in series between $V_{cc}$ and the ground line, and a diode 21. According to this protection circuit, the input buffer circuit 111 is reinforced so that it is reliably protected from an abnormally high voltage of both polarities.

As described above, the circuit elements for forming the input protection circuit 4, that is, the bipolar transistors Q21 and Q22 and the diode D21 are not formed in the region 2a for the input buffer circuit but are formed in the region 2b for the output buffer circuit.

Since the input protection circuit 4 for the input buffer circuit 111 is formed by use of the circuit elements for constituting the output buffer circuit (121) as described above, the dielectric breakdown strength of the input buffer circuit 111 formed in its buffer portion 2 can be sufficiently improved without forming all the circuit elements necessary for constituting the input protection circuits. Therefore, the utilization ratio of the limited layout area of the semiconductor chip can be improved.

The circuit element having a large driving capacity is used for the output stage of the output buffer circuit (121). If the circuit elements for forming the output stage of the output buffer circuit (121) are used as the circuit elements for constituting the input protection circuit 4, the absorption capacity of the breakdown energy in the input protection circuit 4 can be made sufficiently great. Furthermore, if the bipolar transistors are used as the circuit elements of the output stage, an input protection circuit having a more improved function can be constituted.

Figure 8:
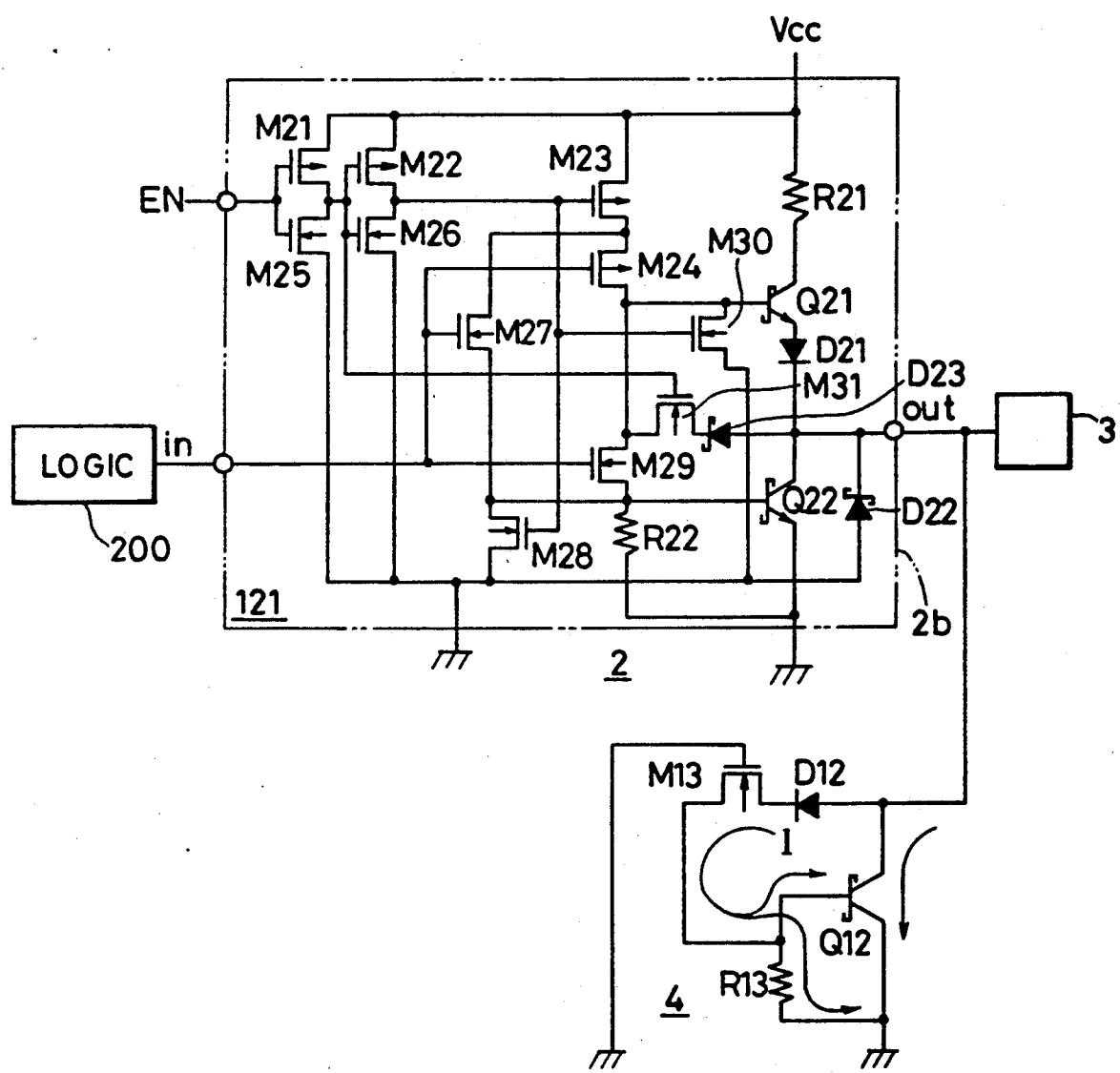
FIG. 8 is a circuit diagram of an output buffer circuit equipped with a protection circuit in accordance with still another embodiment of the present invention.

FIG. 8 shows an output buffer circuit 121 constituted by use of the circuit elements in the region 2b described above as well as the protection circuit 4 which is added to this output buffer circuit. This output buffer circuit 121 is a tristate type inverter, and symbol EN represents a control signal selecting the output state of the output buffer circuit. Though the protection circuit 4 has substantially the same circuit construction as the one shown in FIG. 6, it is constituted by use of those circuit elements (a diode D12, an N-MOS M13, a transistor Q12 and a resistor R13) which are formed in the input buffer portion (see the portion 2a in FIG. 5).

Next, the definite construction of the basic cell 1 will be described with reference to FIGS. 9(a) through 9(c) in order to further clarify the construction of the gate array to which the present invention is applied. As shown in these drawings, circuit elements necessary for constituting a basic logic circuit, that is, a semiconductor base for forming a part or the whole of these circuit elements, is formed inside the basic cell 1.

Figure 9A:
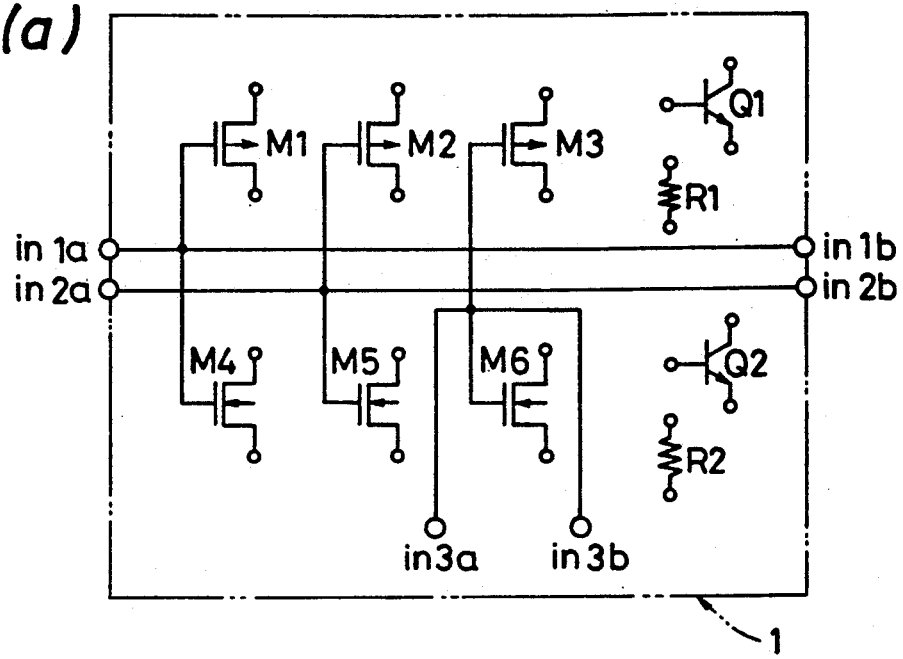
FIG. 9(a) is a circuit diagram of a basic cell in a gate array before aluminum wiring is extended.

Here, a semiconductor base forming a part or the whole of P-channel MOSFETs M1, M2, M3, N-channel MOSFETs M4, M5, M6, resistors R1, R2 and bipolar transistors Q1, Q2, is shown formed in FIG. 9(a).

Figure 9B:
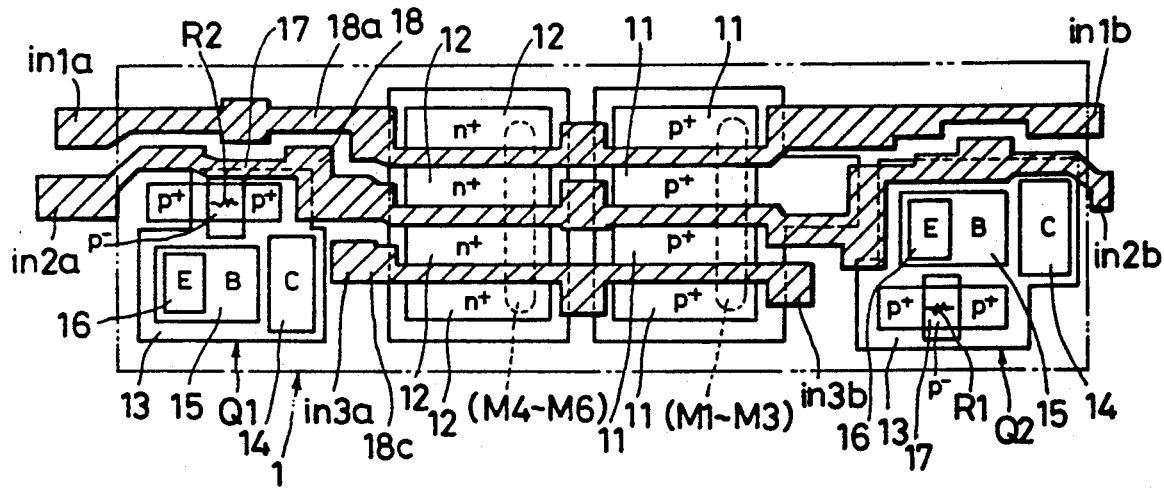
FIG. 9(b) is a plan view of the basic cell shown in FIG. 9(a)

FIG. 9(b) shows the layout state of the basic cell 1 after the semiconductor base described above is formed. In the drawing, reference numeral 11 represents a p+-type doped layer for forming the source-drain regions of the P-channel MOSFETs M1, M2, M3, and reference numeral 12 does an n+-type doped layer for forming the source-drain regions of the N-channel MOSFETs M4, M5, M6. Reference numeral 13 represents a part of an N--type epitaxial layer in which N-P-N bipolar transistors Q1, Q2 are formed, and reference numeral 14 represents a doped layer for current collection of a collector C. Reference numeral 15 represents a base (B) doped layer; 16 is an emitter (E) doped layer; 17 is a P-type doped layer for forming the resistors R1, R2; and 18a, 18b and 18c are electrode portions which consist of polycrystalline silicon and serve as the gate electrodes of the MOSFETs M1 through M6 and also as cell terminal portions in1a, in1b, in2a, in2b, in3a and in3b. In this case, in1a, in1b, in2a and in2b are extended out from the basic cell 1, but in3a and in3b are placed inside the basic cell 1 as hidden terminal portions. These terminal portions in3a and in3b are used for mutually connecting adjacent cells 1.

Figure 9C:
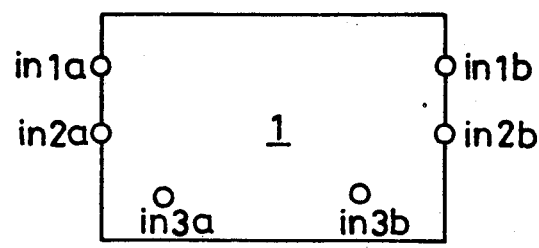
FIG. 9(c) is a symbolic representation of the basic cell in FIG. 9(a).

FIG. 9(c) shows the basic cell 1 described above as a block.

Figure 10A:
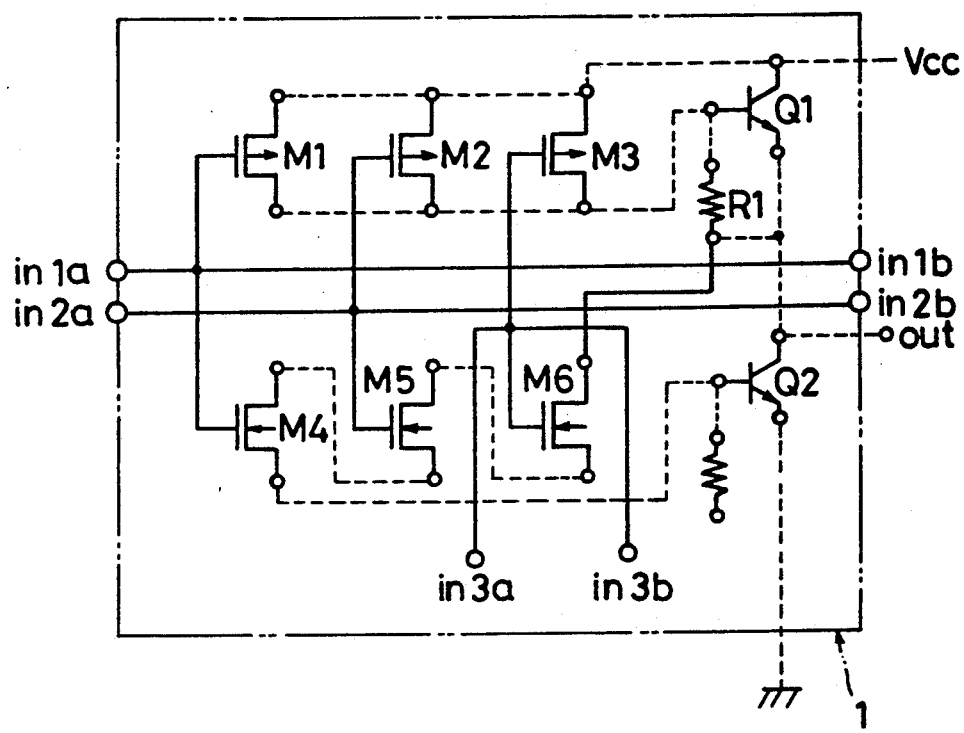
FIG. 10(a) is a circuit diagram of the basic cell shown in FIG. 9(a) after the aluminum wiring is formed.
Figure 10B:
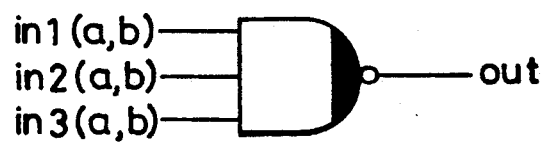
FIG. 10(b) is a logic symbol diagram showing the circuit function of the basic cell shown in FIG. 10(a).

FIGS. 10(a) and 10(b) show an example of the circuit consisting of the basic cells 1.

FIG. 10(a) shows a circuit having logic symbols shown in FIG. 10(b). In this case, the pre-stage side of the circuit consists of MOSFETs M1 through M6 that are connected in a complementary arrangement, while its output stage consists of bipolar transistors Q1 and Q2. This circuit arrangement can reduce the power consumption and can speed up the operating speed due to high driving force, as well.

In accordance with the present invention, the input protection circuit of the input buffer circuit, for example, is constituted by use of the circuit elements necessary for constituting the output buffer circuit, and the dielectric breakdown strength of the input buffer circuit, which is formed at the buffer portion, can be sufficiently improved without forming all the circuit elements necessary for constituting the input protection circuit at the buffer portion.

Although the present invention has thus been described with reference to the preferred embodiment thereof, it is not particularly limited thereto but can of course be practiced in various modified forms without departing from the spirit and scope of the invention. Although the present invention can be applied particularly effectively to master slice ICs such as gate arrays, it can naturally be applied to a variety of semiconductor devices such as analog-digital hybrid ICs.

What is claimed is:

1. A semiconductor integrated circuit device comprising:
   an input terminal for receiving an input signal;
   first and second voltage supply terminals for receiving first and second supply voltages, respectively;
   an input circuit including:
      a first bipolar transistor having a base coupled to the input terminal, a collector coupled to the second voltage supply terminal, and an emitter,
      a first resistor coupled between the first voltage supply terminal and the emitter of the first bipolar transistor,
      a p-channel MOSFET having a gate coupled to the emitter of the first bipolar transistor, a source coupled to the first voltage supply terminal, and a drain, and
      a n-channel MOSFET having a gate coupled to the emitter of the first bipolar transistor, a source coupled to the second voltage supply terminal, and a drain coupled to the drain of the p-channel MOSFET; and
   input protection means coupled to the base of the first bipolar transistor for protecting the first bipolar transistor from an external surge, the input protection means including:
      a second bipolar transistor having an emitter-collector path coupled between the base of the first bipolar transistor and the second voltage supply terminal,
      a second resistor coupled between the base of the second bipolar transistor and the second voltage supply terminal,
      a first diode having an anode coupled to the base of the first bipolar transistor, and a cathode, and
      a third resistor coupled between the cathode of the first diode and the base of the second bipolar transistor.

2. A semiconductor integrated circuit device according to claim 1, wherein the input circuit further includes:
   an output terminal;
   a first output bipolar transistor having a collector-emitter path coupled between the first voltage supply terminal and the output terminal, and a base coupled to the drain of the p-channel MOSFET;
   a second output bipolar transistor having a collector-emitter path coupled between the output terminal and the second voltage supply terminal, and a base;
   a second n-channel MOSFET having a source-drain path coupled between the output terminal and a base of the second output bipolar transistor, and a gate coupled to the gate of the p-channel MOSFET;
   a fourth resistor coupled between the base of the first output bipolar transistor and the output terminal; and p1 a fifth resistor coupled between the base of the second output bipolar transistor and the second voltage supply terminal.

3. A semiconductor integrated circuit device according to claim 2, wherein the first and second output bipolar transistors are of an NPN type.

4. A semiconductor integrated circuit device according to claim 2, wherein the third resistor includes at least one MOSFET having the source-drain path coupled between the cathode of the first diode and the base of the second bipolar transistor, and a gate coupled to the second voltage supply terminal.

5. A semiconductor integrated circuit device according to claim 1, wherein the input circuit further includes a second diode coupled between the base of the first bipolar transistor and the second voltage supply terminal.

6. A semiconductor integrated circuit device according to claim 5, wherein the input circuit further includes a third diode coupled between the first voltage supply terminal and a first resistor.

7. A semiconductor integrated circuit device according to claim 1, wherein the first bipolar transistor is of a PNP type, and wherein the second bipolar transistor is of an NPN type.

8. A semiconductor integrated circuit device according to claim 1, wherein the third resistor includes first and second n-channel MOSFETs, source-drain paths of which are coupled in series between the cathode of the first diode and the base of the second bipolar transistor, and gates of which are coupled to the second voltage supply terminal.

9. An input protection circuit, in a semiconductor integrated circuit device, coupled between an input terminal pad and an input circuit comprising:
   a voltage supply terminal;
   a bipolar transistor having an emitter coupled to the voltage supply terminal, a collector coupled to the input terminal pad, and a base;
   a resistor coupled between the base of the bipolar transistor and the voltage supply terminal,
   a diode having an anode coupled to the collector of the bipolar transistor, and a cathode, and
   a second resistor coupled between the cathode of the diode and the base of the bipolar transistor.

10. An input protection circuit according to claim 9, wherein the second resistor includes first and second n-channel MOSFETs, source-drain paths of which are coupled in series between the cathode of the diode and the base of the bipolar transistor, and gates of which are coupled to the voltage supply terminal.

11. An input protection circuit according to claim 6, wherein the bipolar transistor is of NPN type.

* * * * *